(12) United States Patent
Lai et al.

(10) Patent No.: US 10,720,559 B2
(45) Date of Patent: Jul. 21, 2020

(54) LIGHT-EMITTING DIODE DEVICE AND MANUFACTURING METHOD THEREOF

(71) Applicant: Lextar Electronics Corporation, Hsinchu (TW)

(72) Inventors: Lung-Kuan Lai, Hsinchu County (TW); Pei-Song Cai, Miaoli County (TW); Jian-Chin Liang, Hsinchu (TW); Hao-Chung Chan, New Taipei (TW); Hong-Zhi Liu, New Taipei (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 24 days.

(21) Appl. No.: 16/153,823

(22) Filed: Oct. 7, 2018

(65) Prior Publication Data

US 2019/0123252 A1 Apr. 25, 2019

(30) Foreign Application Priority Data

Oct. 25, 2017 (CN) .......................... 2017 1 1058113

(51) Int. Cl.
*H01L 33/62* (2010.01)
*H01L 33/50* (2010.01)
(Continued)

(52) U.S. Cl.
CPC .......... *H01L 33/62* (2013.01); *H01L 25/0753* (2013.01); *H01L 33/50* (2013.01);
(Continued)

(58) Field of Classification Search
CPC ..... H01L 33/62; H01L 25/0753; H01L 33/56; H01L 33/50; H01L 33/486;
(Continued)

(56) References Cited

U.S. PATENT DOCUMENTS 8,350,283 B2 1/2013 Nishiuchi et al.
8,946,750 B2 2/2015 Higuchi et al.
(Continued)

FOREIGN PATENT DOCUMENTS

CN 101996959 A 3/2011
CN 102290517 A 12/2011
(Continued)

*Primary Examiner* — Fernando L Toledo
*Assistant Examiner* — Adam S Bowen
(74) *Attorney, Agent, or Firm* — CKC & Partners Co., LLC

(57) ABSTRACT

A light-emitting diode (LED) device and a manufacturing method thereof are provided. The LED device includes a frame body, a first conductive extension structure, a second conductive extension structure, and a LED chip. The frame body includes an upper surface, a bottom, a recess on the opposite side of the bottom, and a first side surface and a second side surface opposite to each other. The first and second conductive extension structures are located in the frame body. The first and second conductive extension structures extend from the first side surface to the second side surface of the frame body. The frame body encapsulates a left side surface, a right side surface, a top surface, and a bottom surface of each of the first and second conductive extension structures. The LED chip is disposed in the recess and includes a first conductive pad and a second conductive pad.

19 Claims, 15 Drawing Sheets

(51) Int. Cl.
  *H01L 33/56* (2010.01)
  *H01L 25/075* (2006.01)
  *H01L 33/48* (2010.01)

(52) U.S. Cl.
  CPC ............ *H01L 33/56* (2013.01); *H01L 33/486* (2013.01); *H01L 2933/005* (2013.01); *H01L 2933/0033* (2013.01); *H01L 2933/0066* (2013.01)

(58) Field of Classification Search
  CPC ..... H01L 2933/0066; H01L 2933/0033; H01L 2933/005
  USPC ......................................................... 257/79
  See application file for complete search history.

(56) References Cited

U.S. PATENT DOCUMENTS

| | | | | |
|---|---|---|---|---|
| 2011/0073889 | A1* | 3/2011 | Sugizaki | H01L 25/048 257/98 |
| 2011/0266560 | A1* | 11/2011 | Yao | H01L 33/0079 257/88 |
| 2011/0291148 | A1* | 12/2011 | Sugizaki | H01L 33/44 257/99 |
| 2011/0297983 | A1* | 12/2011 | Nishiuchi | H01L 33/647 257/98 |
| 2011/0300651 | A1* | 12/2011 | Kojima | H01L 33/0079 438/29 |
| 2015/0044793 | A1 | 2/2015 | Naka | |
| 2017/0084587 | A1* | 3/2017 | Hung | H01L 33/60 |
| 2018/0083168 | A1* | 3/2018 | Huang | H01L 33/60 |
| 2018/0123001 | A1* | 5/2018 | Hung | H01L 33/486 |
| 2018/0138378 | A1* | 5/2018 | Hung | H01L 33/56 |

FOREIGN PATENT DOCUMENTS

| | | |
|---|---|---|
| CN | 102738323 A | 10/2012 |
| CN | 103325933 A | 9/2013 |
| CN | 105895747 A | 8/2016 |
| EP | 2903039 A1 | 8/2015 |
| JP | 2011258657 A | 12/2011 |
| TW | 201349573 A | 12/2013 |
| TW | 201351719 A | 12/2013 |
| TW | I495150 B | 8/2015 |
| TW | I560902 B | 12/2016 |

* cited by examiner

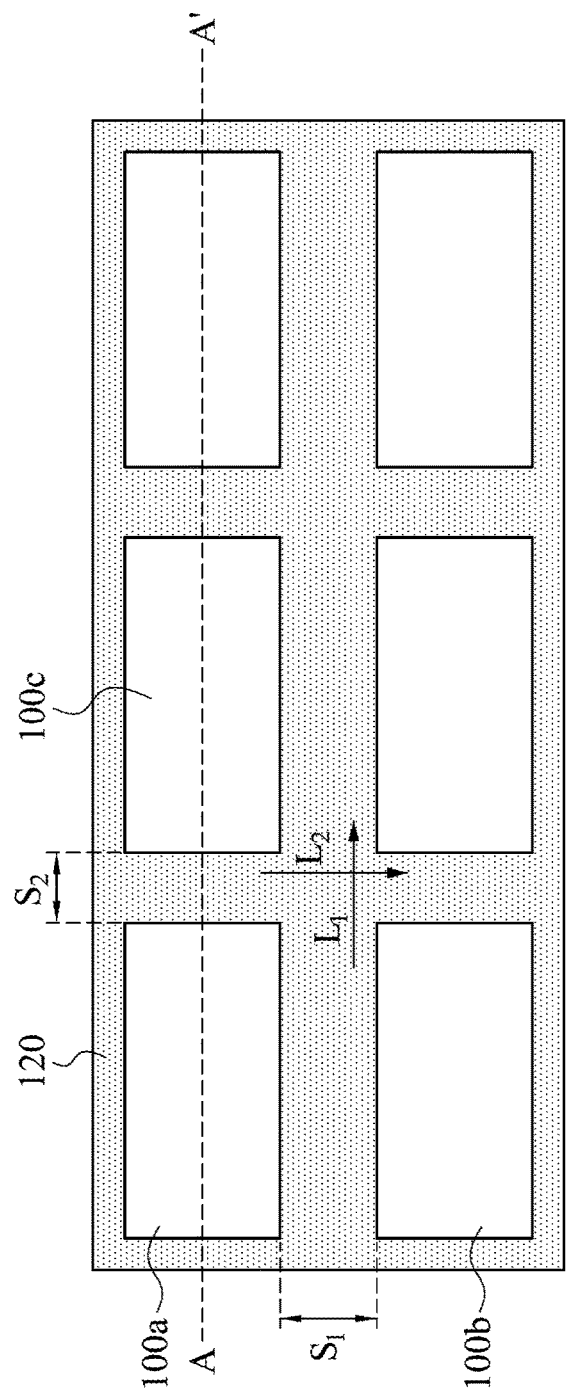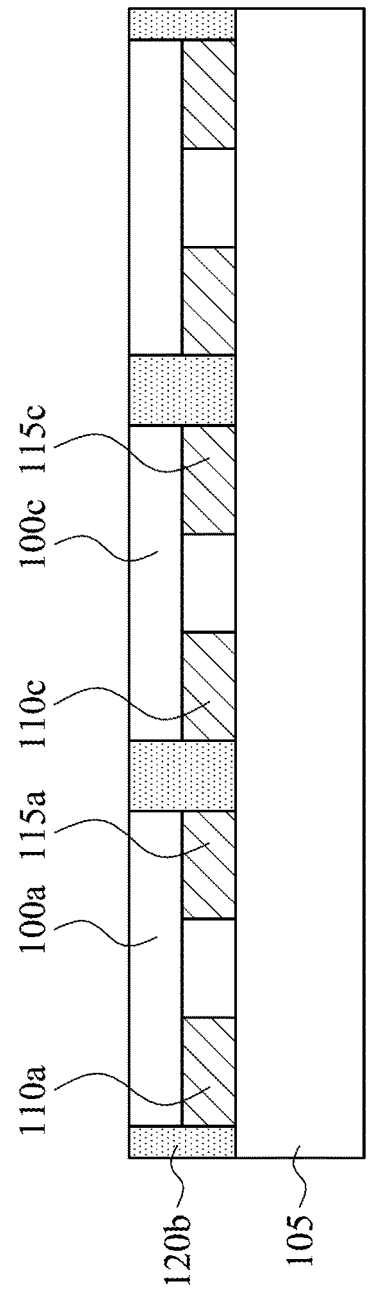

LIGHT-EMITTING DIODE DEVICE AND MANUFACTURING METHOD THEREOF

CROSS-REFERENCE TO RELATED APPLICATION

This application claims priority to Chinese Application Serial Number 201711058113.7, filed Oct. 25, 2017, which is herein incorporated by reference.

BACKGROUND

Field of Invention

The present invention relates to a light-emitting diode (LED) device, and more particularly to a light-emitting diode device having a conductive extension structure.

Description of Related Art

A light-emitting diode (LED) is essentially a diode having a P-N junction, and the recombination of electron-hole pairs causes photon emission when elements are active. In addition, LED has the advantages of energy saving, long life cycle and environmentally friendly, and is therefore one of the booming industries in recent years. In general, different LEDs may have different package structures depending on a light source system and the purpose of use, such as a Lamp LED, a Surface-Mount Device LED (SMD LED), and a Flip Chip LED; or can be roughly classified into a Side View LED and a Top View LED according to a light output surface of the LED.

The Side View LED package is typically made of resin or ceramic and has an opening on the side surface. This opening is used for providing a mounting area for the LED chip so that the excitation light can be laterally emitted. It has been known that the Side View LED also includes a leadframe that extends to below the package, and the heat dissipation path of which is limited to the outer wire that is a portion of the electrical contact surface in the leadframe, such that it is difficult to effectively dissipate the heat generated by the LED chip. In view of the foregoing, developing an LED package with higher performance while maintaining low cost is currently a pressing problem to be solved.

SUMMARY

An aspect of the present invention provides a light-emitting diode device, including a frame body, a first conductive extension structure, a second conductive extension structure, and a light-emitting diode chip. The frame body includes an upper surface, a bottom, a recess located on an opposite side to the bottom, and a first side surface and a second side surface opposite to each other. The first conductive extension structure and the second conductive extension structure are located in the frame body, in which the first conductive extension structure and the second conductive extension structure extend from the first side surface of the frame body to the second side surface of the frame body, and the frame body encapsulates a left side surface, a right side surface, a top surface, and a bottom surface of each of the first conductive extension structure and the second conductive extension structure. The light-emitting diode chip is disposed in the recess and includes a first conductive pad and a second conductive pad in contact with the top surfaces of the first conductive extension structure and the second conductive extension structure, respectively.

According to some embodiments of the present invention, the light-emitting diode device further includes a wavelength conversion layer disposed above the light-emitting diode chip in the recess.

According to some embodiments of the present invention, the wavelength conversion layer has a light output surface coplanar with the upper surface of the frame body.

According to some embodiments of the present invention, the light-emitting diode device further includes a wavelength conversion layer, in which the wavelength conversion layer covers the light-emitting diode chip and the upper surface of the frame body.

According to some embodiments of the present invention, the light-emitting diode device further includes a third side surface and a fourth side surface opposite to each other, and the first conductive extension structure and the second conductive extension structure extend to the third side surface and the fourth side surface, respectively.

According to some embodiments of the present invention, the left side surface of the first conductive extension structure extends toward the third side surface and/or the right side surface of the second conductive extension structure extends toward the fourth side surface.

According to some embodiments of the present invention, the left side surface of the first conductive extension structure extends beyond the third side surface and/or the right side surface of the second conductive extension structure extends beyond the fourth side surface.

According to some embodiments of the present invention, the frame body includes $TiO_2$.

According to some embodiments of the present invention, the first conductive extension structure and the second conductive extension structure have a same material.

According to some embodiments of the present invention, the wavelength conversion layer includes at least one fluorescent material.

Another aspect of the present invention provides a method of manufacturing a light-emitting diode device, including: providing or receiving a first light-emitting diode chip and a second light-emitting diode chip, in which each of the first and second light-emitting diode chips includes a first conductive pad and a second conductive pad; disposing the first and second light-emitting diode chips on a carrier, in which the first conductive pad and the second conductive pad are adjacent to the carrier, and a first gap exists between the first light-emitting diode chip and the second light-emitting diode chip; forming a first sealant on the carrier, the first sealant filling the first gap; removing the carrier to form an intermediate structure having the first light-emitting diode chip, the second light-emitting diode chip, and the first sealant; forming a first conductive extension layer and a second conductive extension layer on the intermediate structure, in which the first conductive extension layer extends from the first conductive pad of the first light-emitting diode chip to the first conductive pad of the second light-emitting diode chip via the first sealant, and the second conductive extension layer extends from the second conductive pad of the first light-emitting diode chip to the second conductive pad of the second light-emitting diode chip via the first sealant; forming a second sealant covering the intermediate structure, the first conductive extension layer and the second conductive extension layer; and dicing the first sealant, the second sealant, the first conductive extension layer, and the second conductive extension layer along a first dicing region between the first light-emitting diode chip and the second light-emitting diode chip, thereby forming a first dicing surface, in which the first dicing surface exposes a cross-section of the first conductive extension layer and a cross-section of the second conductive extension layer.

According to some embodiments of the present invention, forming the first sealant on the carrier includes: forming a first sealant material covering the first light-emitting diode chip and the second light-emitting diode chip; and polishing the first sealant material to expose the first light-emitting diode chip and the second light-emitting diode chip.

According to some embodiments of the present invention, prior to removing the carrier, the method further includes: forming a first fluorescent layer and a second fluorescent layer above the first light-emitting diode chip and the second light-emitting diode chip, in which a spacing exists between the first fluorescent layer and the second fluorescent layer; and forming a third sealant in the spacing.

According to some embodiments of the present invention, the step of providing or receiving the first light-emitting diode chip and the second light-emitting diode chip further includes providing a third light-emitting diode chip, in which the third light-emitting diode chip includes a third conductive pad; in which the step of disposing the first light-emitting diode chip and the second light-emitting diode chip on the carrier further includes disposing the third light-emitting diode chip on the carrier, the third light-emitting diode chip is disposed on one side of the first light-emitting diode chip, a second gap exists between the third light-emitting diode chip and the first light-emitting diode chip, and a longitudinal direction of the second gap is substantially perpendicular to a longitudinal direction of the first gap.

According to some embodiments of the present invention, the first sealant fills the second gap in the step of forming the first sealant on the carrier; and in which in the step of removing the carrier to form the intermediate structure, the intermediate structure further includes the third light-emitting diode chip.

According to some embodiments of the present invention, in the step of forming the first conductive extension layer and the second conductive extension layer, the second conductive extension layer extends along the longitudinal direction of the first gap toward the third conductive pad of the third light-emitting diode chip, but not covering the third conductive pad.

According to some embodiments of the present invention, in the step of forming the first conductive extension layer and the second conductive extension layer, the second conductive extension layer extends to the third conductive pad of the third light-emitting diode chip.

According to some embodiments of the present invention, the method of manufacturing a light-emitting diode device further includes dicing the first sealant, the second sealant, the first conductive extension layer, and the second conductive extension layer along a second dicing region between the first light-emitting diode chip and the third light-emitting diode chip, thereby forming a second dicing surface, in which the second dicing surface exposes another cross-section of the second conductive extension layer.

BRIEF DESCRIPTION OF THE DRAWINGS

The aspects of the present disclosure will be better understood by reading the following detailed description in conjunction with the accompanying drawings. However, it should be noted that in accordance with the standard practices of this industry, various features are not drawn to scale. In fact, the dimensions of the various features can be arbitrarily enlarged or reduced for clarity of discussion.

FIG. 1, FIG. 4, FIG. 7, FIG. 10, FIG. 12, and FIG. 19 are schematic top views of a light-emitting diode device in various manufacturing stages according to some embodiments.

FIG. 2, FIG. 5, FIG. 8, FIG. 11, and FIG. 13 illustrate schematic cross-sectional views along the line A-A' in FIG. 1, FIG. 4, FIG. 7, FIG. 10, and FIG. 12, respectively.

DETAILED DESCRIPTION

Figure 1:
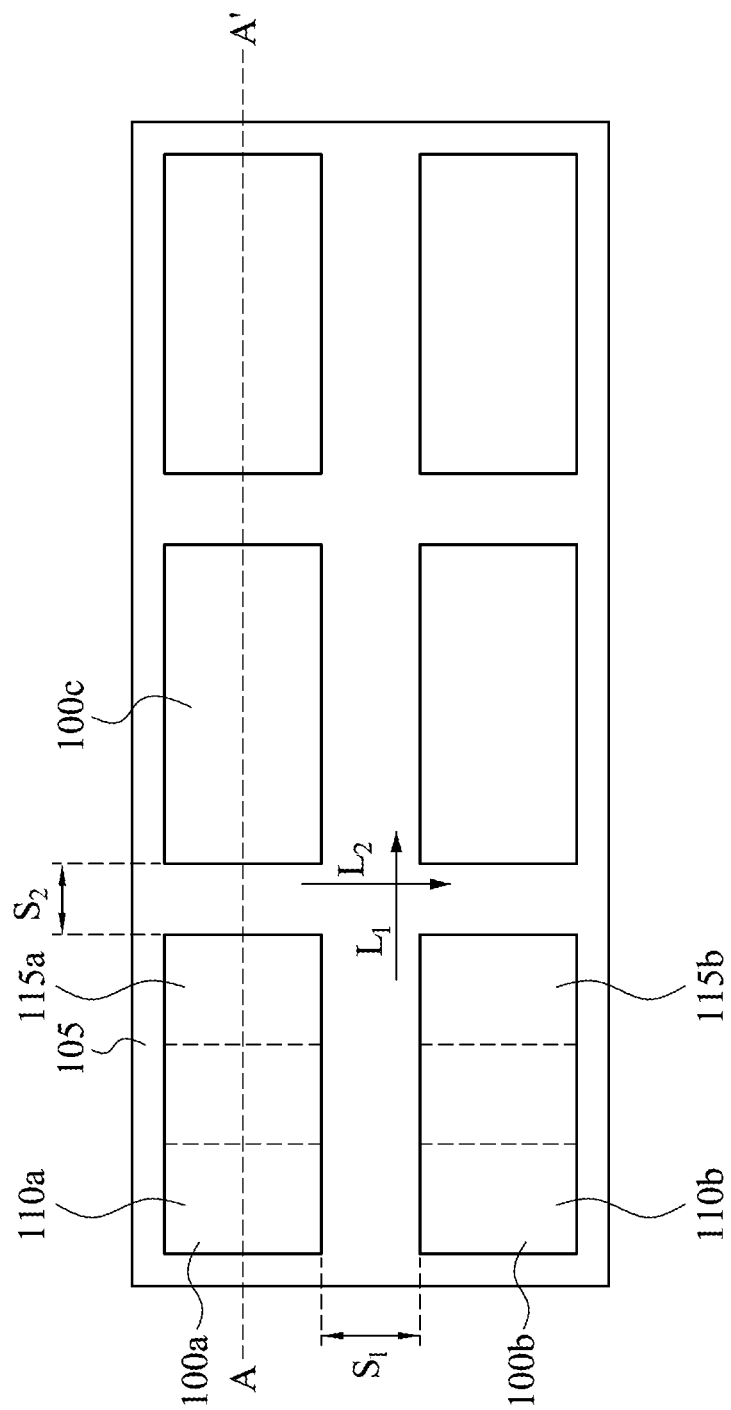

The disclosure in the following will provide many different embodiments or examples to implement different features in the disclosure. The compositions and configurations in each specific embodiment will be described below to simplify the disclosure. These are only examples of the embodiments and are not intended to limit the disclosure. For example, a first element formed "over" or "above" a second element may include embodiments that the first element is in direct contact with the second element, or other additional component(s) are included between the first element and the second element such that there is no direct contact between the first element and the second element. Moreover, in various examples of the disclosure, reference numerals and/or alphabets will be repeatedly used. This repetition is for the purpose of simplification and clarity, and it does not determine the relationship between the various embodiments and/or structural configurations. In addition, various features may be drawn in different proportions for simplification and clarity.

Further, terms like "below," "under," "lower," "over," "higher," and other similar relative spatial relationships may be used herein to describe the relationship between an element or feature and another element or feature in the figures. The terms of the relative spatial relationships are intended to encompass various orientations of the device in use or operation in addition to the orientations described in the figures. For example, if a device in the figures is turned over, elements or features previously described as "below" or "under" other elements or features become "above" the other elements or features. Therefore, examples of the term "below" can encompass both above and below orientations. Such device can have other orientations (rotating 90 degrees or in other directions), and then the relative spatial relationships can also be interpreted in the above manner.

FIG. 1 to FIG. 14 illustrate schematic views of a method of manufacturing a light-emitting diode device in various manufacturing stages according to some embodiments.

Figure 2:
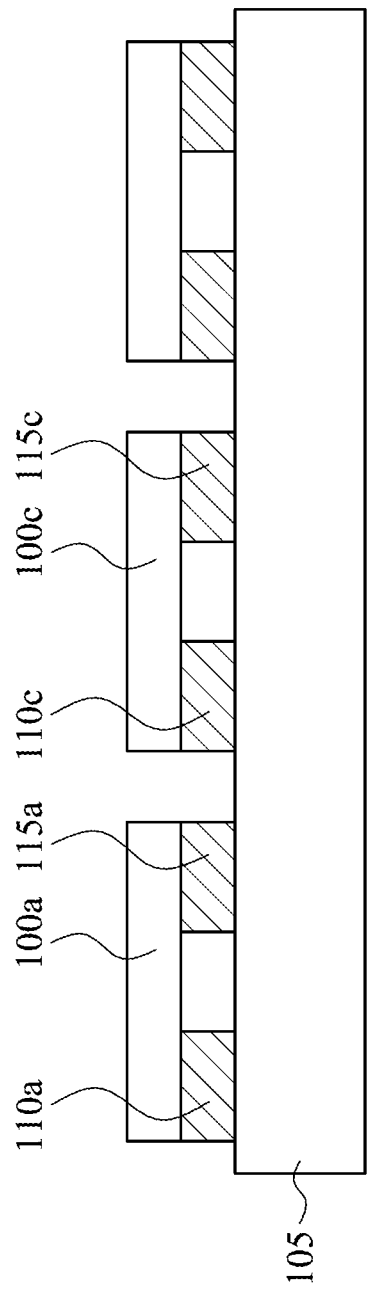

FIG. 1 illustrates a schematic top view of a manufacturing stage in a manufacturing method of a light-emitting diode device, and FIG. 2 illustrates a schematic cross-sectional view along the line A-A' in FIG. 1. As shown in FIG. 1 and FIG. 2, firstly, a first light-emitting diode chip 100a and a second light-emitting diode chip 100b are provided or received. The first light-emitting diode chip 100a includes a first conductive pad 110a and a second conductive pad 115a. The second light-emitting diode chip 100b includes a first conductive pad 110b and a second conductive pad 115b. Next, the first light-emitting diode chip 100a and the second light-emitting diode chip 100b are disposed on a carrier 105, such that the first conductive pad 110a and the second conductive pad 115a of the first light-emitting diode chip 100a, together with the first conductive pad 110b and the second conductive pad 115b of the second light-emitting diode chip 100b are adjacent to the carrier 105. In an embodiment, the carrier 105 includes an adhesive layer for temporarily fixing each of the light-emitting diode chips to the carrier 105. In some embodiments, the configurations (or chip arrangements) as described above may be differently adjusted depending on the requirements of subsequent processes. In addition, a first gap S1 exists between the first light-emitting diode chip 100a and the second light-emitting diode chip 100b.

According to some embodiments, the step of providing or receiving the first light-emitting diode chip 100a and the second light-emitting diode chip 100b further includes providing a third light-emitting diode chip 100c. The third light-emitting diode chip 100c also includes a third conductive pad 110c and a fourth conductive pad 115c. Accordingly, the step of disposing the first light-emitting diode chip 100a and the second light-emitting diode chip 100b on the carrier 105 as described above further includes disposing the third light-emitting diode chip 100c on the carrier 105. The third light-emitting diode chip 100c is disposed on one side of the first light-emitting diode chip 100a, and a second gap S2 exists between the third light-emitting diode chip 100c and the first light-emitting diode chip 100a. In addition, a longitudinal direction L2 of the second gap S2 is substantially perpendicular to a longitudinal direction L1 of the first gap S1.

In another embodiment, the manufacturing method of a light-emitting diode device as described above may further include disposing more light-emitting diode chips. The structure of the light-emitting diode chips may be similar to or the same as that of the first light-emitting diode chip 100a and the second light-emitting diode chip 100b, and therefore is not repeated herein.

Figure 3:
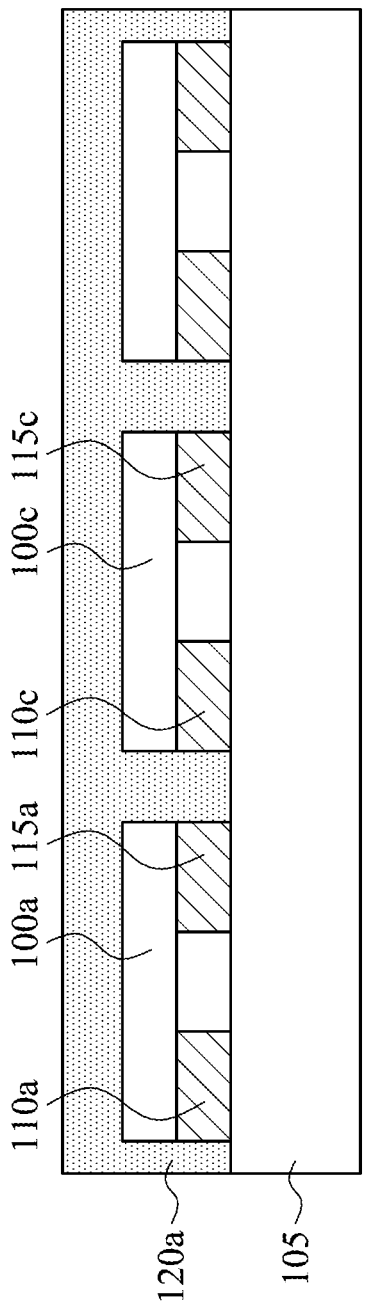
FIG. 3, FIG. 6, FIG. 9, FIG. 14, and FIG. 20 are schematic cross-sectional views of a light-emitting diode device in various manufacturing stages according to some embodiments.

Referring to FIG. 3, after the arrangements of the light-emitting diode chips, a first sealant material 120a is then formed on the carrier 105. The first sealant material 120a fills at least the first gap S1. In an embodiment, the first sealant material 120a further fills the second gap S2 and the gaps between the light-emitting diode chips on the carrier 105, and the first sealant material 120a covers at least the first light-emitting diode chip 100a, the second light-emitting diode chip 100b, and the third light-emitting diode chip 100c. In some embodiments, the first sealant material 120a can be formed in a variety of known methods. For example, in this stage, a mold and a platen may be used for molding, and a sealant raw material may be injected into the gaps between the light-emitting diode chips and covering the light-emitting diode chips, and then the sealant raw material is cured to form the first sealant material 120a. In an embodiment, the first sealant material 120a may include various reflective materials, such as $SiO_2$, $TiO_2$, silica gel, resin, or a combination thereof, but is not limited thereto.

Next, FIG. 4 illustrates a schematic top view of a manufacturing stage in the manufacturing method of a light-emitting diode device, and FIG. 5 illustrates a schematic cross-sectional view along the line A-A' in FIG. 4. As shown in FIG. 4 and FIG. 5, the first sealant material 120a is polished, such that the first light-emitting diode chip 100a, the second light-emitting diode chip 100b and the third light-emitting diode chip 100c are exposed, and a first sealant 120b is formed. The first sealant 120b fills the first gap S1 and the second gap S2. The periphery of each of the light-emitting diode chips is surrounded by the first sealant 120b. In an embodiment, the first sealant material 120a is polished to expose at least an upper surface of the first light-emitting diode chip 100a. The exposed upper surface is coplanar with an upper surface of the first sealant 120b.

Figure 6:
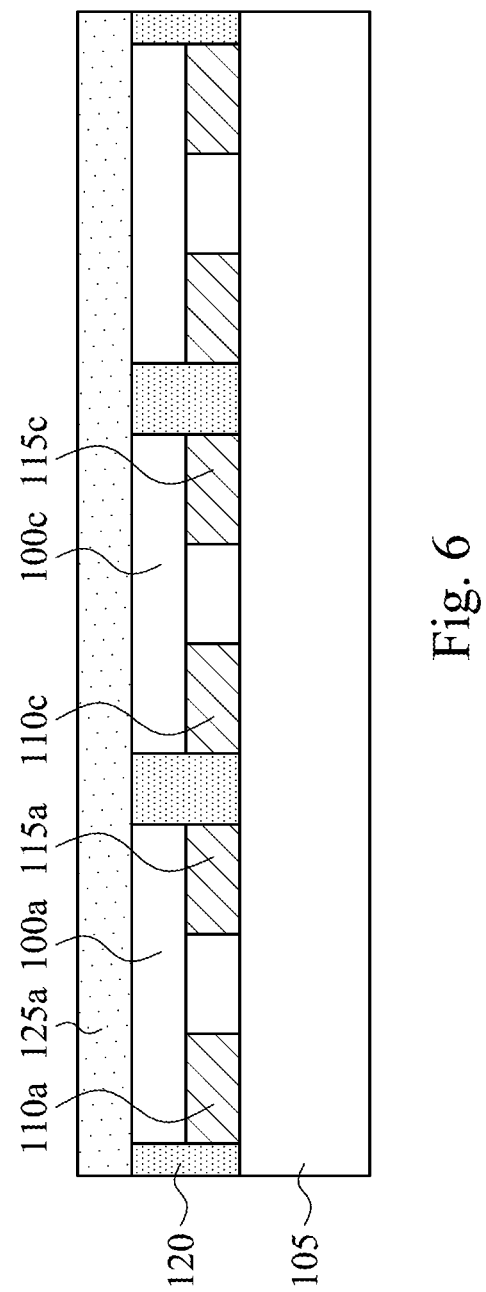

Next, as shown in FIG. 6, a wavelength conversion material layer 125a is formed over the first light-emitting diode chip 100a and each of the light-emitting diode chips. The wavelength conversion material layer 125a contains a wavelength converting material, which may be, for example, fluorescent powder, a colorant, other suitable wavelength converting pigments, or a combination thereof. In an embodiment, the wavelength conversion material layer 125a is formed over each of the light-emitting diode chips by a coating process or any other suitable process.

Figure 7:
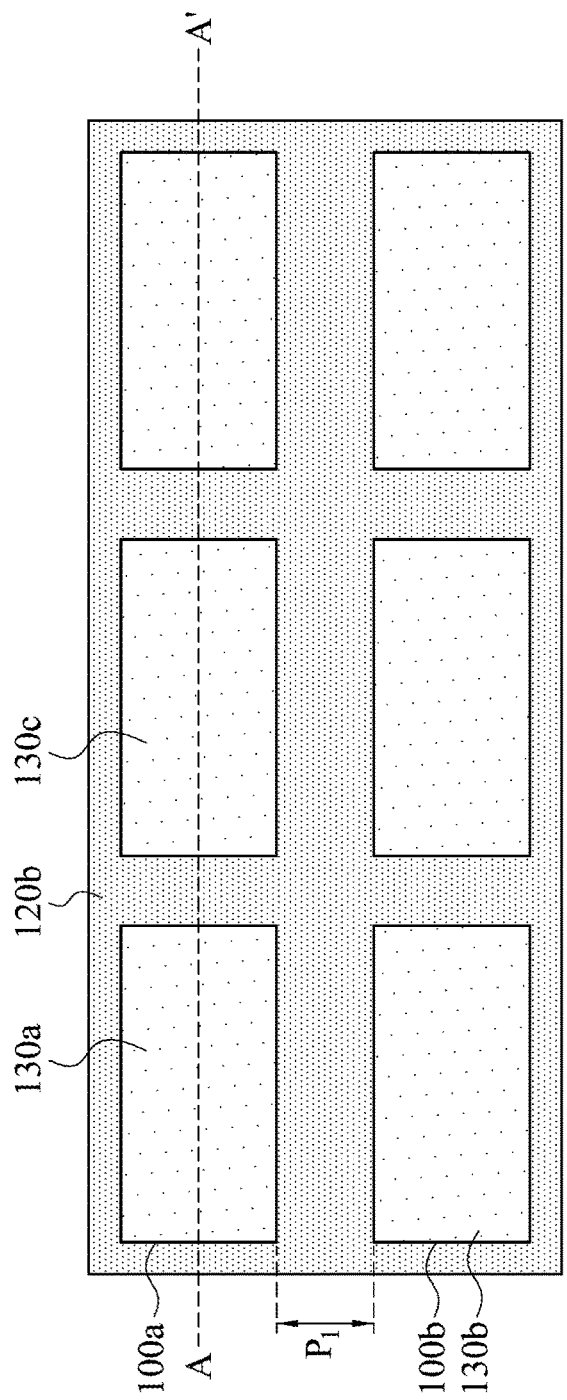
Figure 8:
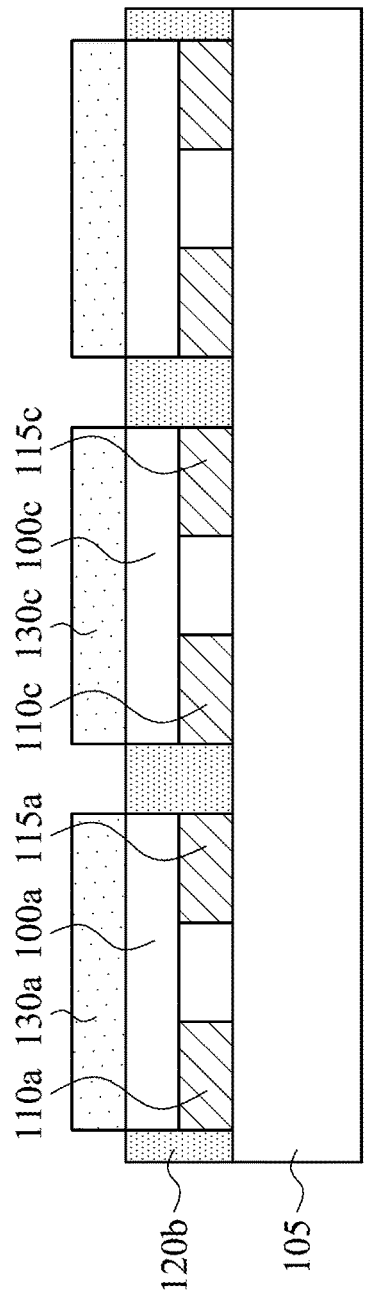

FIG. 7 illustrates a schematic top view of a manufacturing stage in the manufacturing method of a light-emitting diode device. FIG. 8 illustrates a schematic cross-sectional view along the line A-A' in FIG. 7. In this stage, the wavelength conversion material layer 125a is patterned to form a plurality of wavelength conversion layers, such as a first wavelength conversion layer 130a and a second wavelength conversion layer 130b. The first wavelength conversion layer 130a and the second wavelength conversion layer 130b are respectively located above the first light-emitting diode chip 100a and the second light-emitting diode chip 100b. In some embodiments, the patterned wavelength conversion material layer 125a also includes a third wavelength conversion layer 130c. The patterning step causes each of the wavelength conversion layers are separated and spaced apart from each other. For example, a pitch P1 exists between the first wavelength conversion layer 130a and the second wavelength conversion layer 130b. In an embodiment, the pitch P1 and the first gap S1 during the chip arrangements are the same.

Figure 9:
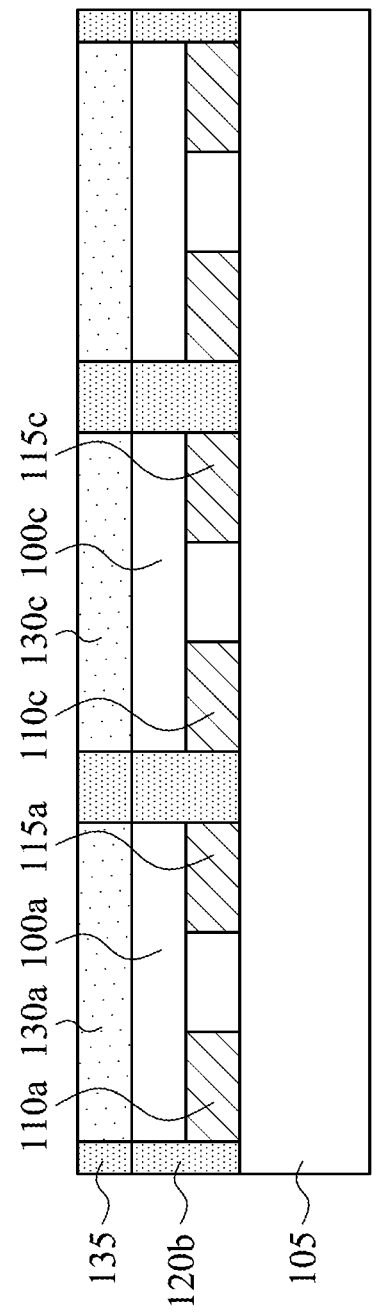

Next, as shown in FIG. 9, a third sealant 135 is formed surrounding each of the wavelength conversion layers. For example, the third sealant 135 is formed in the pitch P1 and further fills the gaps between adjacent ones of wavelength conversion layers, such that the first wavelength conversion layer 130a over the first light-emitting diode chip 100a is surrounded by the third sealant 135. The light emitted by the first light-emitting diode chip 100a is not travelling upward and perpendicular to the first wavelength conversion layer 130a. In other words, some of the light emitted by the first light-emitting diode chip 100a may travel towards both sides of the first wavelength conversion layer 130a. With the present of the third sealant 135 surrounding the first wavelength conversion layer 130a over the first light-emitting diode chip 100a, the light emitted by the first light-emitting diode chip 100a and travelling towards both sides of the first wavelength conversion layer 130a may be reflected by the third sealant 135. Therefore, the light output area of the first light-emitting diode chip 100a can be effectively controlled by the third sealant 135, such that the output light may be more convergent.

Figure 10:
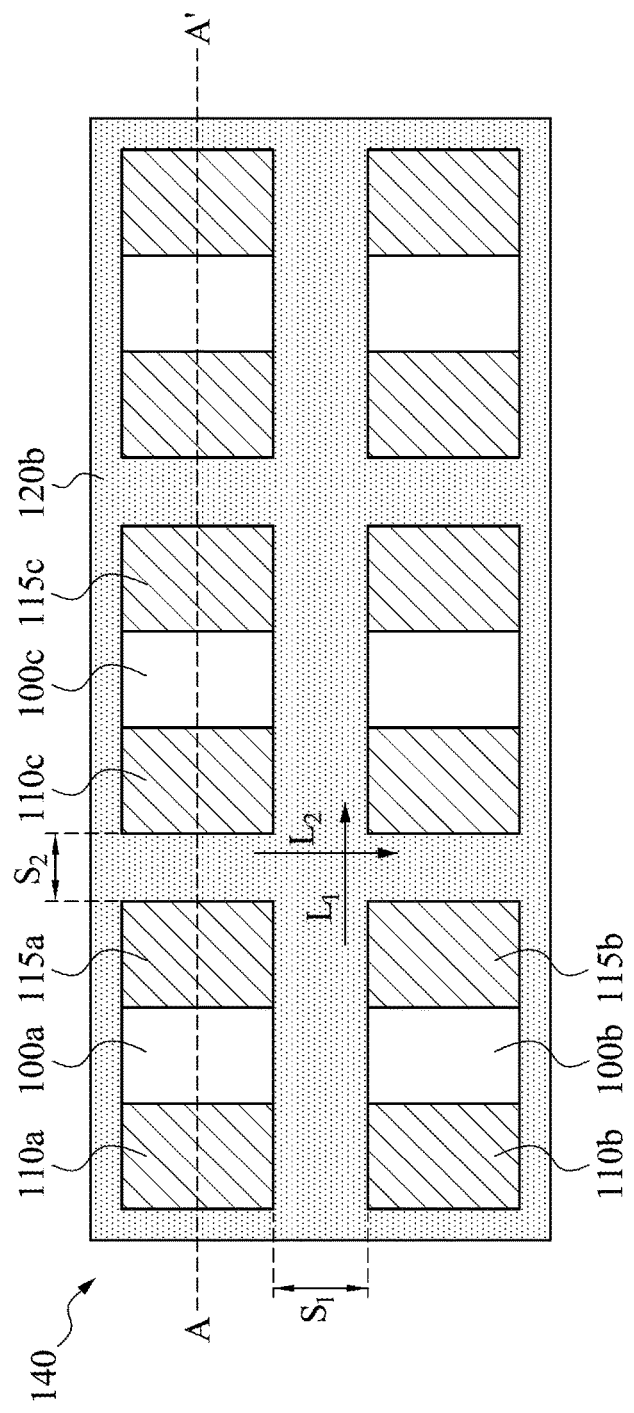
Figure 11:
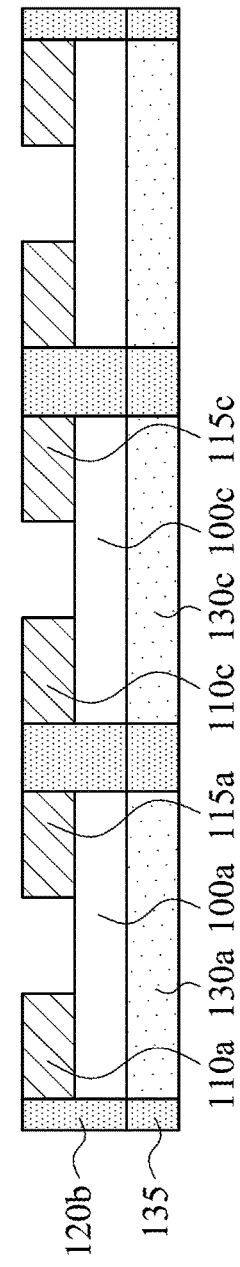

FIG. 10 illustrates a schematic top view of a manufacturing stage in the manufacturing method of a light-emitting diode device, and FIG. 11 illustrates a schematic cross-sectional view along the line A-A' in FIG. 10. In this stage, the carrier 105 is removed to form an intermediate structure 140. FIG. 10 and FIG. 11 are schematic views of the intermediate structure 140 that is inverted after the carrier 105 is removed. The first conductive pad 110a and the second conductive pad 115a of the first light-emitting diode chip 100a are exposed as the carrier 105 is removed. In an embodiment, the intermediate structure 140 may further include a third light-emitting diode chip 100c or other light-emitting diode chips.

Figure 12:
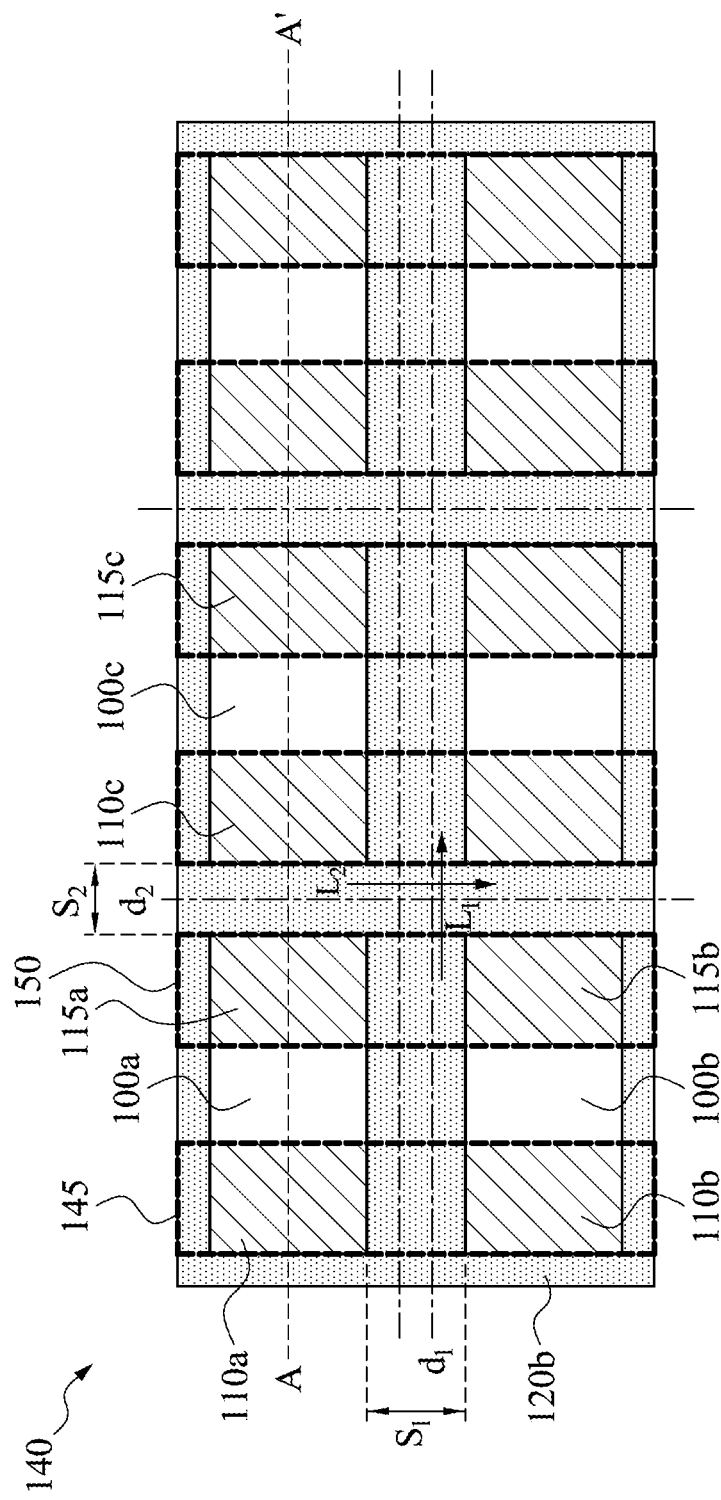
Figure 13:
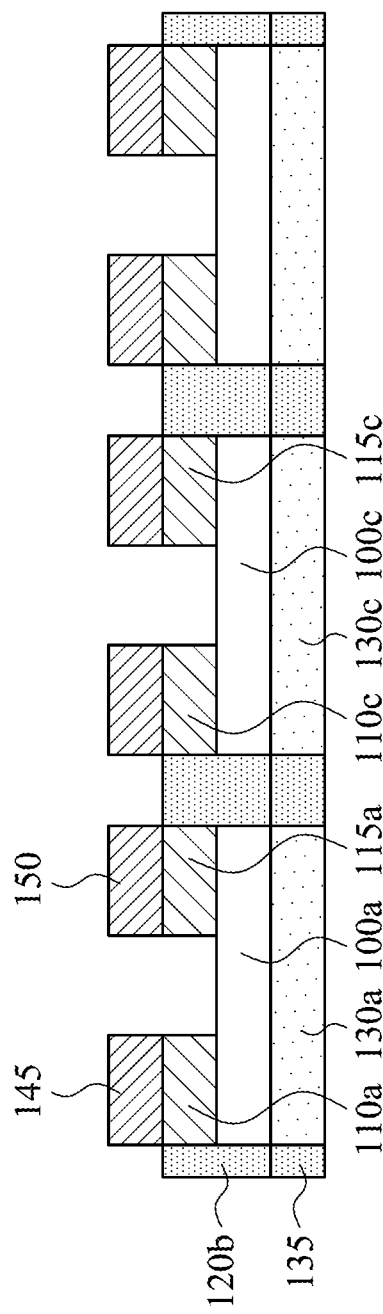

FIG. 12 illustrates a schematic top view of a manufacturing stage in the manufacturing method of a light-emitting diode device. FIG. 13 illustrates a schematic cross-sectional view along the line A-A' in FIG. 12. In this stage, on each of the exposed conductive pads, a plurality of conductive extension structures are formed, such as a first conductive extension layer 145 (the region enclosed by a bold dashed line 145) and a second conductive extension layer 150 (the region enclosed by a bold dashed line 150). The first conductive extension layer 145 extends from the first conductive pad 110a of the first light-emitting diode chip 100a to the first conductive pad 110b of the second light-emitting diode chip 100b via the first sealant 120b. The second conductive extension layer 150 extends from the second conductive pad 115a of the first light-emitting diode chip 100a to the second conductive pad 115b of the second light-emitting diode chip 100b via the first sealant 120b. In an embodiment, the first conductive extension layer 145 and the second conductive extension layer 150 may be formed by, for example, a coating process, a sintering process, an electroplating process and/or other suitable processes. Subsequently, referring to FIG. 14, a second sealant 155 is formed covering the intermediate structure 140, the first conductive extension layer 145, and the second conductive extension layer 150, such that the first light-emitting diode chip 100a and the second light-emitting diode chip 100b are encapsulated in the second sealant 155. In an embodiment, the first sealant 120b, the second sealant 155, and the third sealant 135 can be made of the same reflective material.

Figure 14:
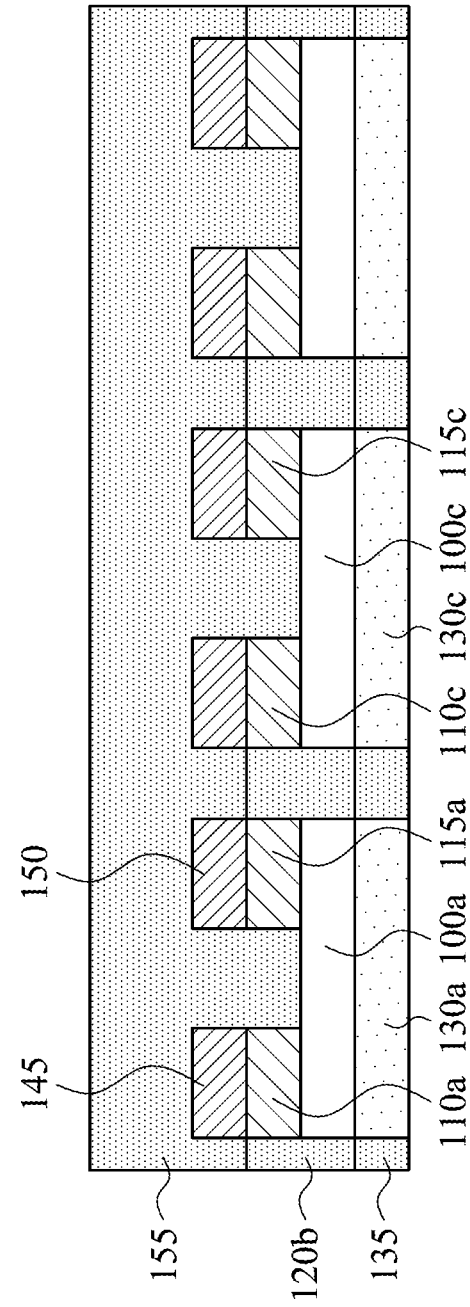

Finally, the structure shown in FIG. 14 is subjected to a dicing process. It is noted that as the structure shown in FIG. 14 is covered by the second sealant 155, the structure of FIG. 14 is a package entirely covered by the second sealant 155 when viewed from the top of second sealant 155. For better understanding of the present embodiment, a dicing region (dicing street) is illustrated in FIG. 12. A first dicing region d1 (or a first dicing street d1) and a second dicing region d2 (or a second dicing street d2) are illustrated in FIG. 12. The second sealant 155, the first conductive extension layer 145, the second conductive extension layer 150, the first sealant 120b, and the third sealant 135 are diced downward and along the first dicing region d1 between the first light-emitting diode chip 100a and the second light-emitting diode chip 100b, thereby forming a first dicing surface. The first dicing surface exposes a cross-section of the first conductive extension layer 145 and a cross-section of the second conductive extension layer 150. Next, at least the second dicing region d2 is subjected to a dicing process to form a plurality of light-emitting diode devices which are separated from each other. Reference may be made to the embodiment illustrated in FIG. 15A to FIG. 15C for specific structures.

Figure 15A:
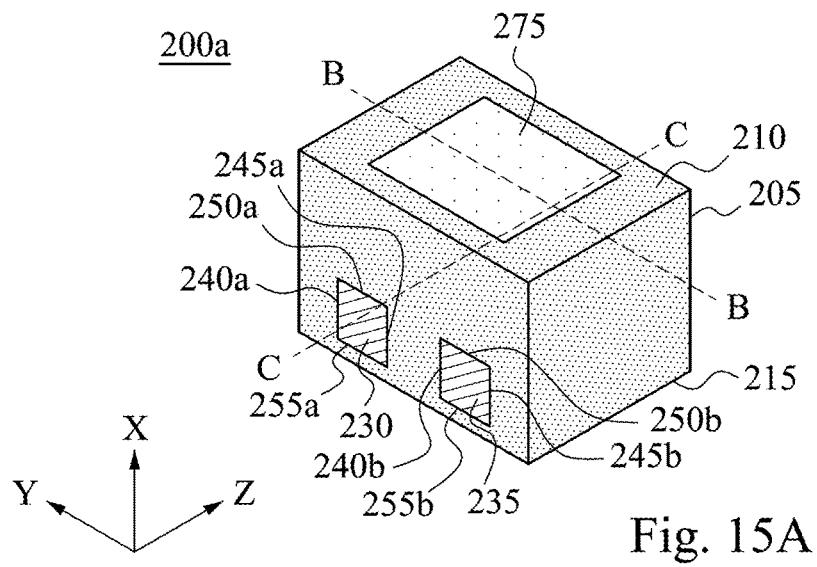
FIG. 15A to FIG. 15C illustrate schematic perspective views of a light-emitting diode device according to some embodiments.
Figure 15B:
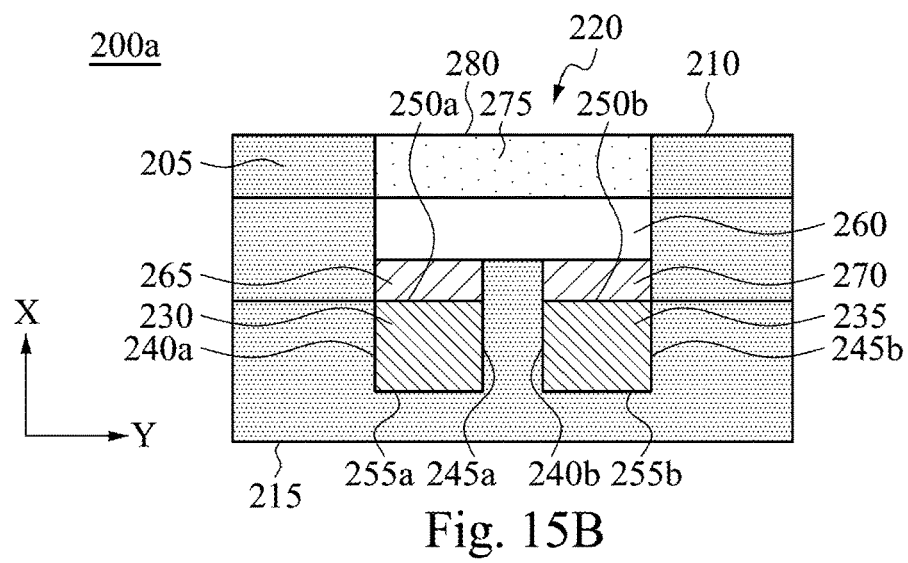
Figure 15C:
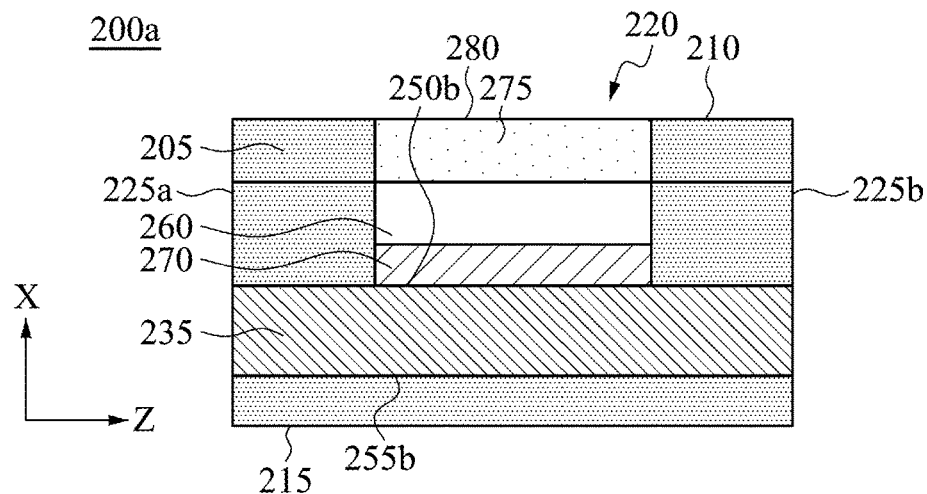

FIG. 15A to FIG. 15C illustrate schematic perspective views of a light-emitting diode device 200a according to an embodiment of the present invention. FIG. 15B illustrates a schematic cross-sectional view along the line B-B in FIG. 15A. FIG. 15C illustrates a schematic cross-sectional view along the line C-C in FIG. 15A. According to the embodiment, the light-emitting diode device 200a includes a frame body 205, a first conductive extension structure 230, a second conductive extension structure 235, a light-emitting diode chip 260, and a wavelength conversion layer 275. The frame body 205 has an upper surface 210, a bottom 215, a recess 220 located on an opposite side to the bottom 215, a first side surface 225a, and a second side surface 225b (which are shown in FIG. 15C). The first side surface 225a and the second side surface 225b are opposite to each other. In an embodiment, the frame body 205 may be a single layer or a multi-layer structure composed of different materials. In an embodiment, the material of the frame body 205 may be, for example, $SiO_2$, $TiO_2$, silica gel, resin, or a combination thereof.

Referring to FIG. 15B, the first conductive extension structure 230 and the second conductive extension structure 235 are located in the frame body 205. In an embodiment, the first conductive extension structure 230 and the second conductive extension structure 235 are made of the same material. In addition, the frame body 205 encapsulates a left side surface 240a (left side surface 240b), a right side surface 245a (right side surface 245b), a top surface 250a (top surface 250b), and a bottom surface 255a (bottom surface 255b) of each of the first conductive extension structure 230 and the second conductive extension structure 235. The light-emitting diode chip 260 is disposed in the recess 220 and includes a first conductive pad 265 and a second conductive pad 270. The first conductive pad 265 is in contact with the top surface 250a of the first conductive extension structures 230, and the second conductive pad 270 is in contact with the top surface 250b of the second conductive extension structures 235. The wavelength conversion layer 275 has a light output surface 280 and is disposed over the light-emitting diode chip 260 in the recess 220. In an embodiment, the light output surface 280 of the wavelength conversion layer 275 is coplanar with the upper surface 210 of the frame body 205.

Additionally, as shown in FIG. 15C, the first conductive extension structure 230 (not shown) and the second conductive extension structure 235 extend from the first side surface 225a of the frame body 205 to the second side surface 225b of the frame body 205, such that both ends of the first conductive extension structure 230 and the second conductive extension structure 235 have a cross-section which is exposed to the outside of the frame body 205. In prior, a conductive pad of a side-view LED package is electrically connected to a leadframe by using a wire bonding technique. Therefore, only the external wires that are connected with the conductive pad and the leadframe could serve as a heat dissipation path of the LED. In this way, the heat generated by the LED along with the light emission is difficult to be effectively dissipated. In contrast, in the light-emitting diode device 200, the first conductive extension structure 230 and the second conductive extension structure 235 are in direct contact with the first conductive pad 265 and the second conductive pad 270 respectively. In addition, both ends of the first and second conductive extension structures 230 and 235 are exposed for electrical connecting to external components. Therefore, with the present of the first conductive extension structure 230 and the second conductive extension structure 235, the heat dissipation path of the light-emitting diode device 200 can be effectively shortened, and the heat dissipation area can be increased. In addition, the thickness of the package may be drastically reduced as the light-emitting diode device 200 does not have a substrate and a leadframe.

Figure 16A:
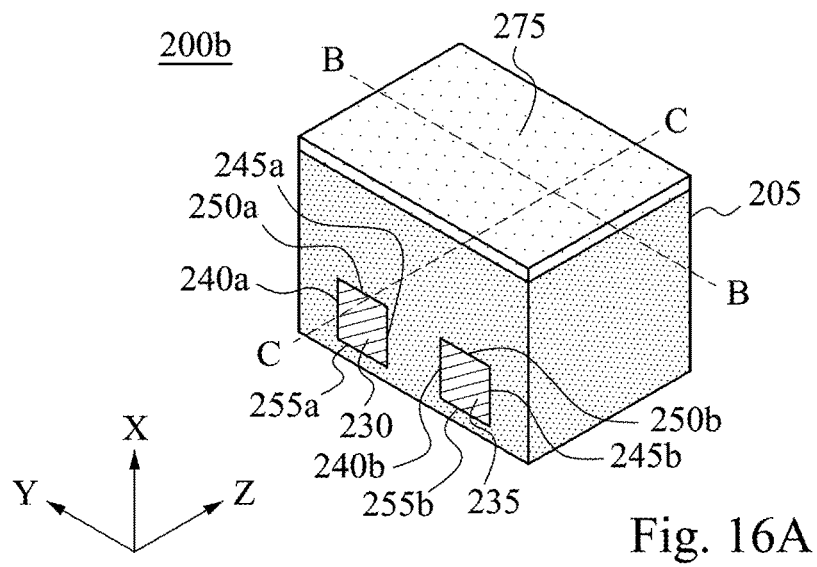
FIG. 16A to FIG. 16C illustrate schematic perspective views of a light-emitting diode device according to some embodiments.
Figure 16B:
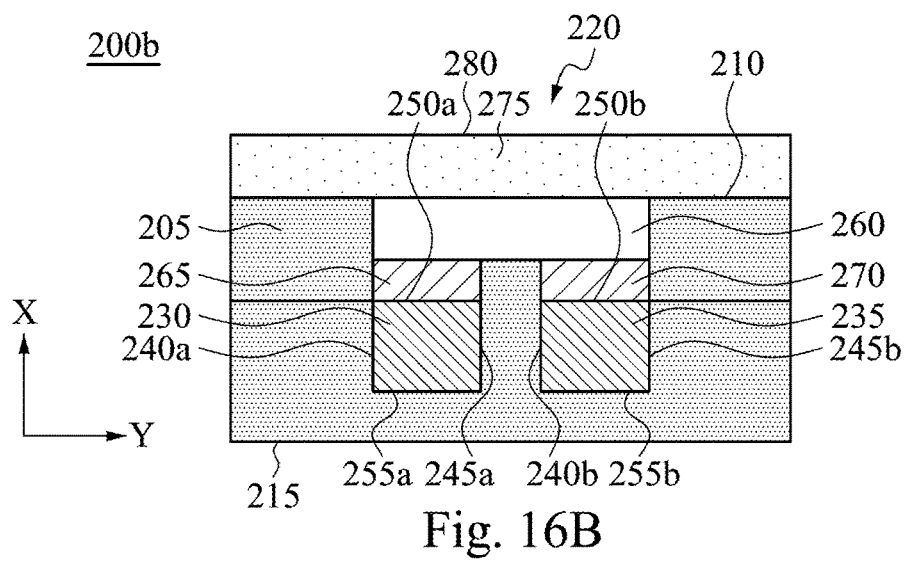
Figure 16C:
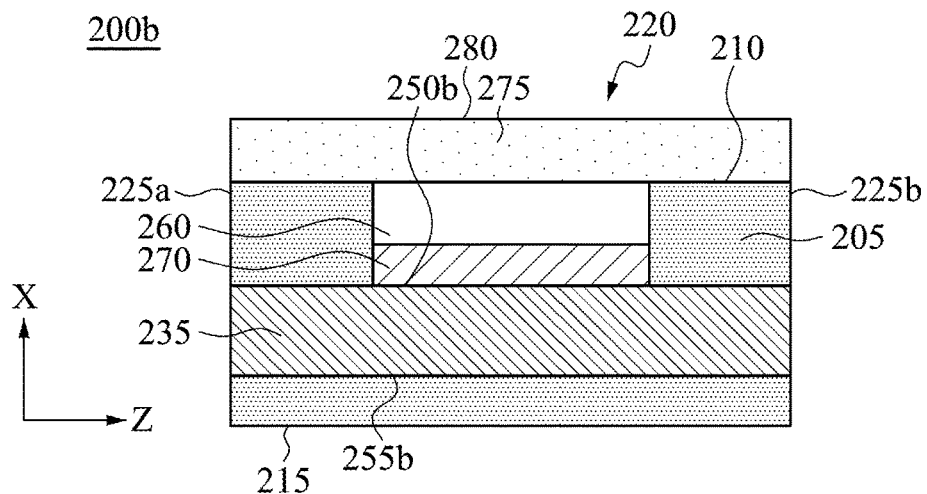

FIG. 16A to FIG. 16C illustrate schematic perspective views of a light-emitting diode device 200b according to another embodiment of the present invention. FIG. 16B and FIG. 16C illustrate schematic cross-sectional views along the line B-B and the line C-C in FIG. 16A respectively. The structure of the light-emitting diode device 200b in FIG. 16A to FIG. 16C is similar to that of the light-emitting diode device 200a in FIG. 15A to FIG. 15C, except that in FIG. 16A to FIG. 16C, the wavelength conversion layer 275 of the light-emitting diode device 200b completely covers the light-emitting diode chip 260 and the upper surface 210 of the frame body 205. In addition, the remaining components, such as the light-emitting diode chip 260, the first conductive extension structure 230, and the second conductive extension structure 235 may be the same as those illustrated in FIG. 15A to FIG. 15C, and therefore are not repeated herein.

Figure 17A:
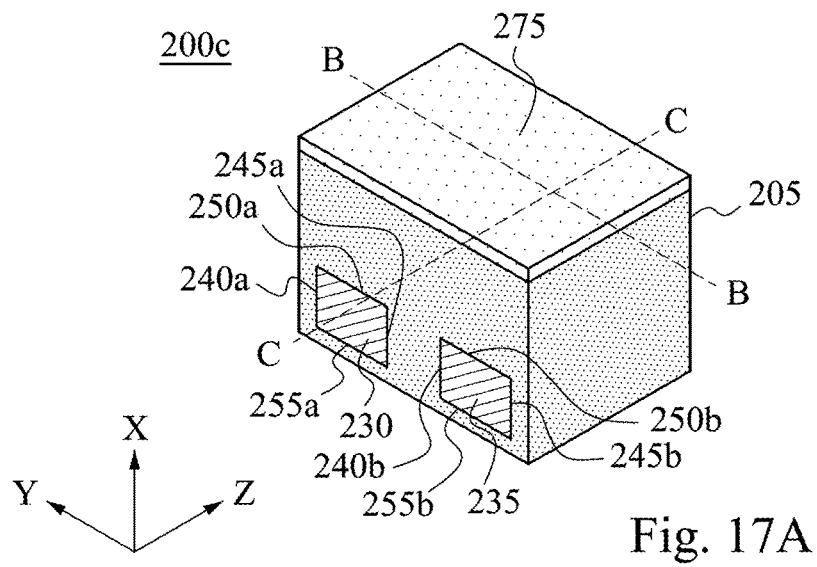
FIG. 17A to FIG. 17C illustrate schematic perspective views of a light-emitting diode device according to some embodiments.
Figure 17B:
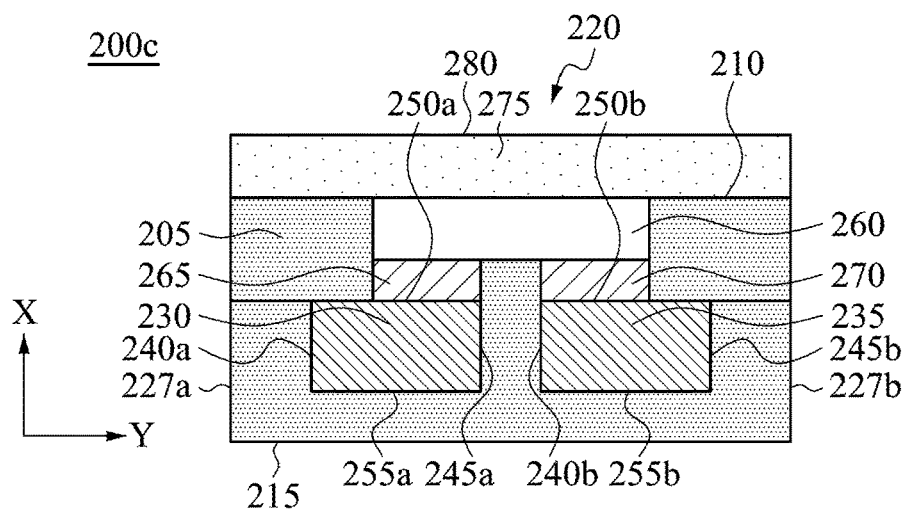
Figure 17C:
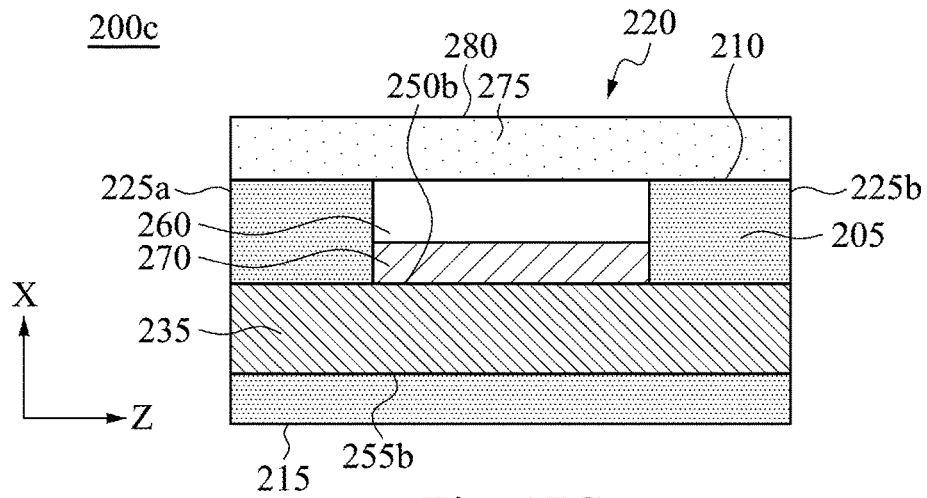

FIG. 17A to FIG. 17C illustrate schematic perspective views of a light-emitting diode device 200c. FIG. 17B and FIG. 17C illustrate schematic cross-sectional views along the line B-B and the line C-C in FIG. 17A respectively. The structure of the light-emitting diode device 200c in FIG. 17A to FIG. 17C is similar to that of the light-emitting diode device 200b in FIG. 16A to FIG. 16C, except that in FIG. 17A to FIG. 17C, the first conductive extension structure 230 and the second conductive extension structure 235 of the light-emitting diode device 200c are exposed to a larger cross-section.

As shown in FIG. 17B, the frame body 205 has a third side surface 227a and a fourth side surface 227b which are opposite to each other. The left side surface 240a of the first conductive extension structure 230 and the right side surface 245b of the second conductive extension structure 235 extend toward the third side surface 227a and the fourth side surface 227b respectively. However, the left side surface 240a and the right side surface 245b are not exposed from the third side surface 227a and the fourth side surface 227b of the frame body 205. Compared with FIG. 15B and FIG. 16B, the first conductive extension structure 230 and the second conductive extension structure 235 illustrated in FIG. 17B have larger cross-sectional areas which are respectively exposed at both ends of the light-emitting diode device 200c (that is, the first side surface 225a and the second side surface 225b). In addition, the remaining components, such as the frame body 205, the light-emitting diode chip 260, and the wavelength conversion layer 275 may be the same as those illustrated in FIG. 16A to FIG. 16C, and therefore are not repeated herein.

Figure 18A:
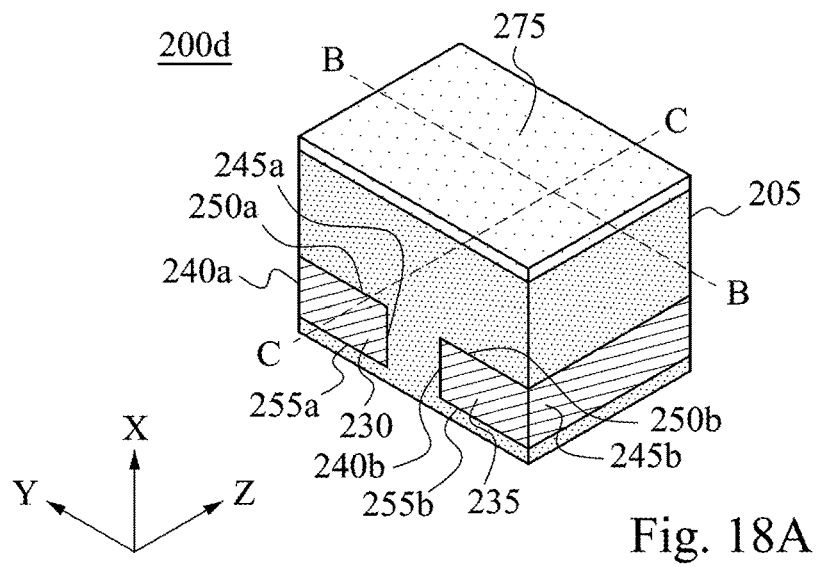
FIG. 18A to FIG. 18C illustrate schematic perspective views of a light-emitting diode device according to some embodiments.
Figure 18B:
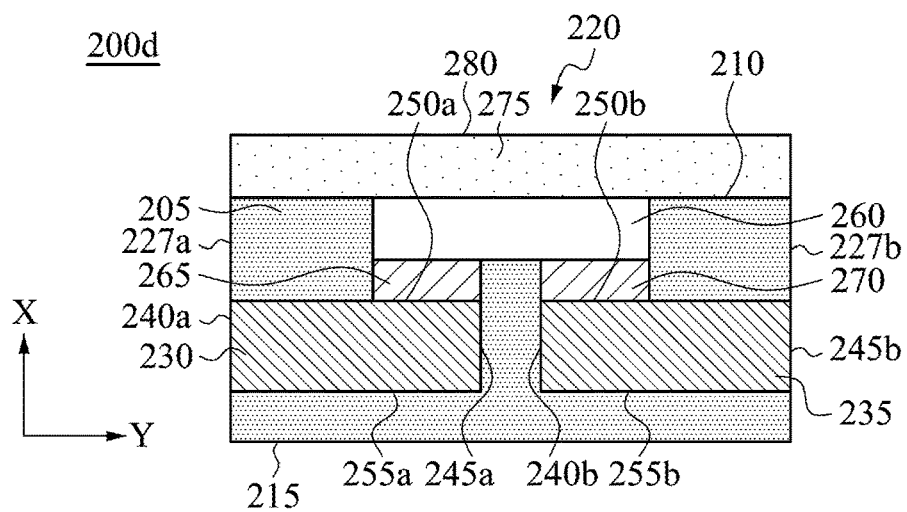
Figure 18C:
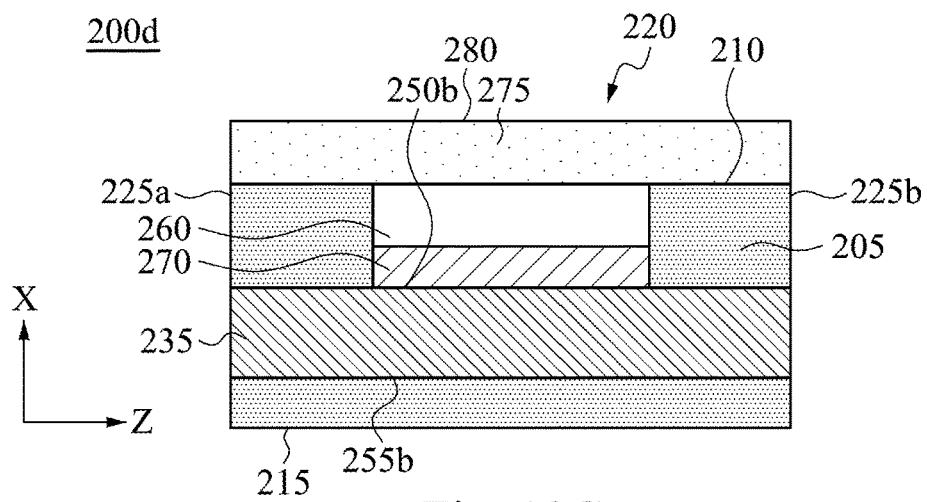

FIG. 18A to FIG. 18C illustrate schematic perspective views of a light-emitting diode device 200d. FIG. 18B and FIG. 18C illustrate schematic cross-sectional views along the line B-B and the line C-C in FIG. 18A respectively. The difference between the light-emitting diode device 200d in FIG. 18A to FIG. 18C and the light-emitting diode device 200c in FIG. 17A to FIG. 17C is the first conductive extension structure 230 and the second conductive extension structure 235 of the light-emitting diode device 200d. Detailed descriptions are given below.

As shown in FIG. 18B, the frame body 205 has a third side surface 227a and a fourth side surface 227b which are opposite to each other. A first conductive extension structure 230 and a second conductive extension structure 235 extend towards the third side surface 227a and the fourth side surface 227b respectively. A left side surface 240a of the first conductive extension structure 230 is exposed from (or protruded from) the third side surface 227a, and a right side surface 245b of the second conductive extension structure 235 is exposed from (or protruded from) the fourth side surface 227b. In other words, the first conductive extension structure 230 extends towards the first side surface 225a, the second side surface 225b, and the third side surface 227a and is exposed. The left side surface 240a of the first conductive extension structure 230 is exposed from the third side surface 227a and abuts the first side surface 225a and the second side surface 225b. Similarly, the second conductive extension structure 235 extends to the first side surface 225a, the second side surface 225b, and the fourth side surface 227b and is exposed. The right side surface 245b of the second conductive extension structure 235 exposed from the fourth side surface 227b abuts the first side surface 225a and the second side surface 225b. Therefore, the light-emitting diode device 200d in FIG. 18A to FIG. 18C includes the first conductive extension structure 230 and the second conductive extension structure 235 each having three exposed integral and continuous contact surfaces. In this way, the heat dissipation path of the LED is reduced, and the heat dissipation area is increased, thereby effectively reducing the temperature at the junction of the chips when the LED emits light.

Figure 19:
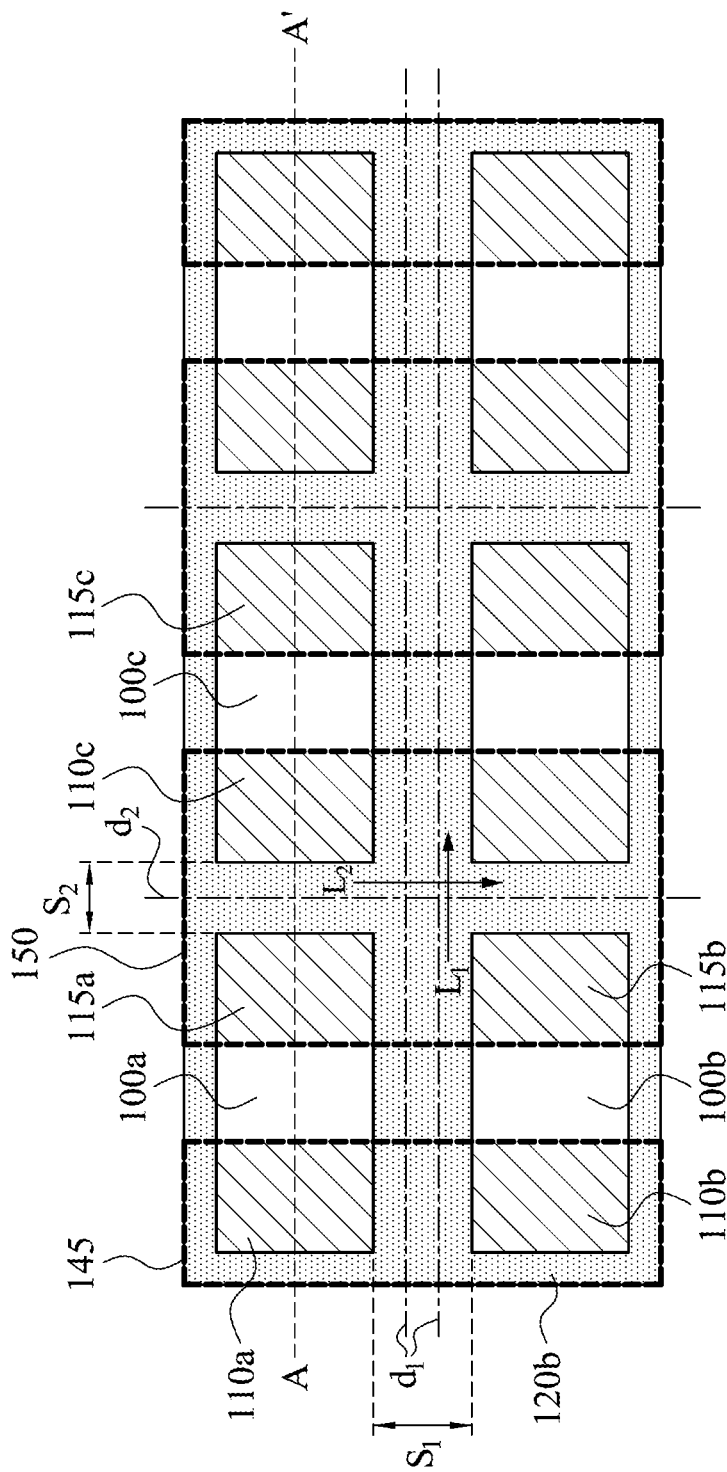
Figure 20:
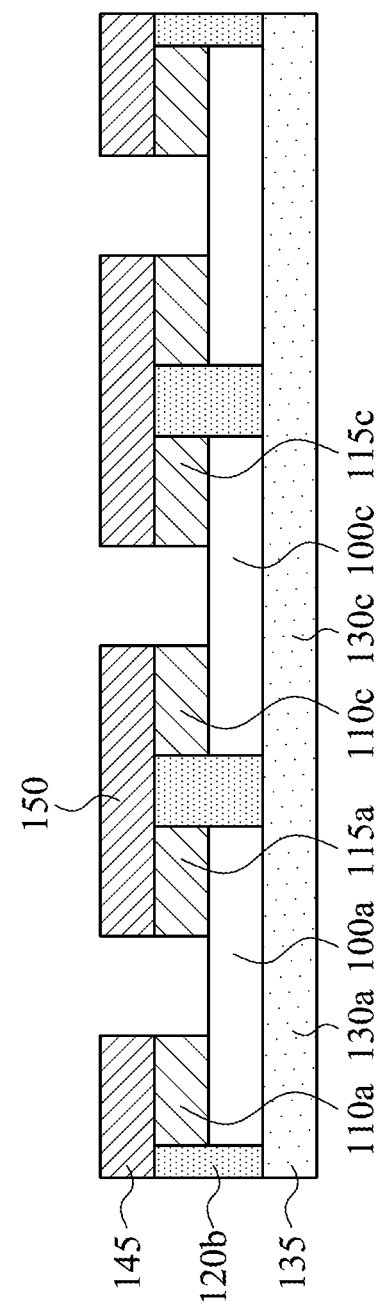

FIG. 19 illustrates a schematic top view of a manufacturing stage in the manufacturing method of the light-emitting diode device 200d according to FIG. 18A to FIG. 18C. FIG. 20 illustrates a schematic cross-sectional view along the line A-A' in FIG. 19. In the step of forming the first conductive extension layer 145 and the second conductive extension layer 150, the second conductive extension layer 150 further extends toward the third light-emitting diode chip 100c along the longitudinal direction L1 of the first gap S1, such that the second conductive extension layer 150 covers the third conductive pad 110c. For ease of explanation, the coverage areas of the first conductive extension layer 145 and the second conductive extension layer 150 in FIG. 19 are marked by bold dashed lines. Next, referring to FIG. 20, the second conductive extension layer 150 covers both the second conductive pad 115a of the first light-emitting diode chip 100a and the third conductive pad 110c of the third light-emitting diode chip 100c. Therefore, during the subsequent dicing process, each of the conductive extension layers has three exposed cross-sections. For example, compared with FIG. 12, in the dicing process of this embodiment, another dicing surface may be further formed by dicing the first sealant 120b, the second sealant 155b and the second conductive extension layer 150 along the second dicing region d2 between the first light-emitting diode chip 100a and the third light-emitting diode chip 100c. Thus, another cross-section of the second conductive extension layer 150 may be exposed from the dicing surface. The exposed cross-section of the second conductive extension layer 150 may be, for example, the right side surface 245b of the second conductive extension structure 235 in FIG. 18B.

The features of several embodiments have been outlined in the foregoing in order to provide a better understanding of the aspects of the disclosure for those skilled in the art. It should be appreciated by those skilled in the art that the disclosure can be readily served as a basis for designing or modifying other processes and structures for achieving the same objectives and/or achieving the same advantages of the embodiments herein. It should also be appreciated by those skilled in the art that such equivalent constructions are not inconsistent with the spirit and scope of the disclosure, and various variations, substitutions and modifications may be made herein without departing from the spirit and scope of the disclosure.

What is claimed is:

1. A light-emitting diode device, comprising:
a frame body comprising an upper surface, a bottom, a recess located on an opposite side to the bottom, and a first side surface and a second side surface opposite to each other;
a first conductive extension structure and a second conductive extension structure located in the frame body, wherein the first conductive extension structure and the second conductive extension structure extend from the first side surface of the frame body to the second side surface of the frame body, and the frame body encapsulates a left side surface, a right side surface, a top surface, and a bottom surface of each of the first conductive extension structure and the second conductive extension structure; and
a light-emitting diode chip disposed in the recess, wherein the light-emitting diode chip includes a first conductive pad and a second conductive pad in contact with the top surfaces of the first conductive extension structure and the second conductive extension structure, respectively.

2. The light-emitting diode device of claim 1, further comprising a wavelength conversion layer disposed above the light-emitting diode chip in the recess.

3. The light-emitting diode device of claim 2, wherein the wavelength conversion layer has a light output surface coplanar with the upper surface.

4. The light-emitting diode device of claim 1, further comprising a wavelength conversion layer, wherein the wavelength conversion layer covers the light-emitting diode chip and the upper surface.

5. The light-emitting diode device of claim 1, further comprising a third side surface and a fourth side surface opposite to each other, wherein the first conductive extension structure and the second conductive extension structure extend to the third side surface and the fourth side surface, respectively.

6. The light-emitting diode device of claim 5, wherein the left side surface of the first conductive extension structure extends toward the third side surface and/or the right side surface of the second conductive extension structure extends toward the fourth side surface.

7. The light-emitting diode device of claim 5, wherein the left side surface of the first conductive extension structure extends beyond the third side surface and/or the right side surface of the second conductive extension structure extends beyond the fourth side surface.

8. The light-emitting diode device of claim 1, wherein the frame body comprises $TiO_2$.

9. The light-emitting diode device of claim 1, wherein the first conductive extension structure and the second conductive extension structure have a same material.

10. The light-emitting diode device of claim 2, wherein the wavelength conversion layer includes at least one fluorescent material.

11. The light-emitting diode device of claim 4, wherein the wavelength conversion layer includes at least one fluorescent material.

12. A method of manufacturing a light-emitting diode device, comprising:
providing or receiving a first light-emitting diode chip and a second light-emitting diode chip, wherein each of the first and second light-emitting diode chips includes a first conductive pad and a second conductive pad;
disposing the first light-emitting diode chip and the second light-emitting diode chip on a carrier, wherein the first conductive pad and the second conductive pad are adjacent to the carrier, and a first gap exists between the first light-emitting diode chip and the second light-emitting diode chip;
forming a first sealant on the carrier, wherein the first sealant fills the first gap;
removing the carrier to form an intermediate structure comprising the first light-emitting diode chip, the second light-emitting diode chip, and the first sealant;
forming a first conductive extension layer and a second conductive extension layer on the intermediate structure, wherein the first conductive extension layer extends from the first conductive pad of the first light-emitting diode chip to the first conductive pad of the second light-emitting diode chip via the first sealant, and the second conductive extension layer extends from the second conductive pad of the first light-emitting diode chip to the second conductive pad of the second light-emitting diode chip via the first sealant;
forming a second sealant covering the intermediate structure, the first conductive extension layer and the second conductive extension layer; and
dicing the first sealant, the second sealant, the first conductive extension layer, and the second conductive extension layer along a first dicing region between the first light-emitting diode chip and the second light-emitting diode chip, thereby forming a first dicing surface, wherein the first dicing surface exposes a cross-section of the first conductive extension layer and a cross-section of the second conductive extension layer.

13. The method of claim 12, wherein forming the first sealant on the carrier further comprises:
forming a first sealant material covering the first light-emitting diode chip and the second light-emitting diode chip; and
polishing the first sealant material to expose the first light-emitting diode chip and the second light-emitting diode chip.

14. The method of claim 12, prior to removing the carrier, further comprising:
forming a first fluorescent layer and a second fluorescent layer above the first light-emitting diode chip and the second light-emitting diode chip, wherein a spacing exists between the first fluorescent layer and the second fluorescent layer; and
forming a third sealant in the spacing.

15. The method of claim 12, wherein the step of providing or receiving the first light-emitting diode chip and the second light-emitting diode chip further comprises providing a third light-emitting diode chip, wherein the third light-emitting diode chip includes a third conductive pad; and
the step of disposing the first light-emitting diode chip and the second light-emitting diode chip on the carrier further comprises disposing the third light-emitting diode chip on the carrier, wherein the third light-emitting diode chip is disposed on one side of the first light-emitting diode chip, a second gap exists between the third light-emitting diode chip and the first light-emitting diode chip, and a longitudinal direction of the second gap is perpendicular to a longitudinal direction of the first gap.

16. The method of claim 15, wherein in the step of forming the first sealant on the carrier, the first sealant fills the second gap;

wherein in the step of removing the carrier to form the intermediate structure, the intermediate structure further comprises the third light-emitting diode chip.

17. The method of claim 16, wherein, in the step of forming the first conductive extension layer and the second conductive extension layer, the second conductive extension layer extends along the longitudinal direction of the first gap toward the third conductive pad of the third light-emitting diode chip, but not covering the third conductive pad.

18. The method of claim 16, wherein, in the step of forming the first conductive extension layer and the second conductive extension layer, the second conductive extension layer extends to the third conductive pad of the third light-emitting diode chip.

19. The method of claim 18, further comprising dicing the first sealant, the second sealant, the first conductive extension layer, and the second conductive extension layer along a second dicing region between the first light-emitting diode chip and the third light-emitting diode chip, thereby forming a second dicing surface, wherein the second dicing surface exposes another cross-section of the second conductive extension layer.

* * * * *